United States Patent [19]

Bhat et al.

[11] Patent Number: 5,713,133
[45] Date of Patent: Feb. 3, 1998

[54] METHODS OF PREPARING CEMENTED METAL CARBIDE SUBSTRATES FOR DEPOSITION OF ADHERENT DIAMOND COATINGS AND PRODUCTS MADE THEREFROM

[75] Inventors: Deepak G. Bhat, Troy; Darrell Johnson; Stephen L. Bennett, both of Rochester Hills, all of Mich.

[73] Assignee: Valenite Inc., Madison Heights, Mich.

[21] Appl. No.: 670,171

[22] Filed: Jun. 27, 1996

Related U.S. Application Data

[62] Division of Ser. No. 266,087, Jun. 27, 1994, Pat. No. 5,560,839.

[51] Int. Cl.$^6$ .................................................. B26B 9/00
[52] U.S. Cl. ................................. 30/350; 30/346.54
[58] Field of Search ................. 30/346.53, 346.54, 30/350; 216/100, 108; 427/249, 307, 309, 590

[56] References Cited

U.S. PATENT DOCUMENTS

| | | | |
|---|---|---|---|
| 3,837,896 | 9/1974 | Lindstrom et al. | 30/346.54 |
| 3,911,576 | 10/1975 | Lane et al. | 30/346.53 |
| 4,162,345 | 7/1979 | Holzl . | |
| 4,707,384 | 11/1987 | Schachner et al. . | |
| 4,731,296 | 3/1988 | Kikuchi et al. . | |
| 4,816,286 | 3/1989 | Hirose . | |
| 4,855,188 | 8/1989 | Garg et al. . | |
| 4,874,642 | 10/1989 | Garg et al. . | |
| 4,910,091 | 3/1990 | Garg et al. . | |
| 4,988,421 | 1/1991 | Drawl et al. . | |
| 4,990,403 | 2/1991 | Ito . | |
| 4,992,082 | 2/1991 | Drawl et al. . | |
| 5,024,901 | 6/1991 | Garg et al. . | |
| 5,068,148 | 11/1991 | Nakahara et al. | 428/335 |
| 5,236,740 | 8/1993 | Peters et al. . | |
| 5,380,408 | 1/1995 | Svensson | 204/129.1 |
| 5,415,674 | 5/1995 | Feistritzer et al. | 427/307 |
| 5,560,839 | 10/1996 | Bennett et al. | 216/100 |

FOREIGN PATENT DOCUMENTS

0384011B1 10/1993 European Pat. Off. ........ C04B 51/85

OTHER PUBLICATIONS

"Cutting Performance of Diamond Deposted Tool for Al–18 mass%Si Alloy", Masaru Yagi, Toshiba Tungaloy Co., Ltd., Yokohama, Japan, pp. 158 & 159.

Metals Handbook, 8th. Edition vol. 8, "Metallography, Structures and Phase Diagrams", American Society for Metals, Metals Park, Ohio, pp. 108 & 109.

1979 Annual Book of ASTM Standards Part 11 "Metallography; Nondestructive Testing", American Society for Testing & Materials, pp. 48–69, 424–441.

Journal De Physique, "Colloque C5", supplement au No. 5, Tome 50, mai 1989.

Bhat et al., "Microstructural Evaluation of CM 500L . . . ", Thin Solid Films, 95 (1982)105–112.

Diamond and Related Materials, 1(1991) 1–12, "Towards a General Concept of Diamond Chemical Vapour Deposition".

Surface and Coatings Technology, 36 (1988) 303–310, "Chemical Vapour Deposition of a Diamond Coating onto a Tungsten Carbide Tool Using Ethanol".

Adhesion and Tribological Properties of Diamond Films on Various Substrates, Cheng–Tzu, et al., National Chiao Tung University Institute of Mechanical Engineering, Taiwan, Republic of China, pp. 2515–2529.

*Primary Examiner*—Hwei-Siu Payer
*Attorney, Agent, or Firm*—Mary K. Cameron

[57] ABSTRACT

Methods for producing an adherent diamond film on a cemented metal carbide substrate are disclosed. Particularly, the present invention discloses methods of preparing the surface of a cemented metal carbide surface such that an adherent polycrystalline diamond coating may be deposited thereon using CVD techniques. Cutting tool inserts produced from such adherent diamond film coated cemented metal carbide articles are also disclosed.

31 Claims, 2 Drawing Sheets

METHODS OF PREPARING CEMENTED METAL CARBIDE SUBSTRATES FOR DEPOSITION OF ADHERENT DIAMOND COATINGS AND PRODUCTS MADE THEREFROM

This is a division of United States patent application Ser. No. 08/266,087, filed Jun. 27, 1994, now U.S. Pat. No. 5,560,839.

BACKGROUND OF THE INVENTION

1. Field of the Invention

The present invention relates to hard coatings for metal carbide substrates. More particularly, the present invention relates to a method of producing an adherent diamond coating on cemented metal carbide articles and the articles so coated.

2. Description of the Related Art

Polycrystalline diamond (PCD) cutting tools, comprising a piece of polycrystalline diamond fastened to the tip of a tool insert are old and well-known in the art. These tools are expensive to manufacture and do not readily lend themselves to indexing for increased tool life. In addition, PCD tooling having complex shapes, i.e., taps, drill bits, endmills, etc., cannot be easily formed using any known techniques. PCD tools are typically run at cutting speeds of around 2,500 SFM when cutting materials such as A-390 aluminum.

Numerous attempts have been made to provide diamond coated tools which have performance approaching that of PCD tools because they would be less costly to manufacture and use, and because diamond coated tools having more complex shapes than are possible with PCD tools are theoretically manufacturable employing substrates such as cemented tungsten carbide.

A significant challenge to the developers of diamond-coated tooling is to optimize adhesion between the diamond film and the substrate to which it is applied, while retaining sufficient surface toughness in the finished product. Substrates like $Si_2N_4$ and SiAlON can only be formed into a few geometries, limiting their commercial potential. Sintered tungsten carbide (WC) substrates without cobalt or other binders have been studied but can be too brittle to perform satisfactorily as tooling in machining applications.

Cemented tungsten carbide substrates incorporating a cobalt binder in concentrations between about 2% and 20% weight % Co, and cubic carbides such as TiC, TaC, NbC, and VC, and combinations thereof in concentrations up to about 30% by weight of Co, have the requisite toughness and thus show the greatest long-term commercial promise for tooling applications. A cemented tungsten carbide substrate with up to 20% cobalt, for example, would provide adequate surface toughness for most machining tasks. Cemented tungsten carbide can be formed into a variety of geometries, making it a potential material for drilling operations, die manufacturing, and other applications of value to the automobile and other industries. It is therefore desirable to provide a way to coat cemented tungsten carbide substrates with a layer of diamond film having adequate adhesion to the substrate for use as a machine tool.

It has been reported in the literature that the use of a cobalt binder in cemented carbides inhibits adhesion of the diamond film to the substrate. (R. Haubner and B. Lux, *Influence of the Cobalt Content in Hot-Pressed Cemented Carbides on the Deposition of Low-Pressure Diamond Layers*, Journal de Physique, Colloque C5, supplement au no. 5, pp. C5-156–169, Toma 50, (May 1989)). Indeed, conventional wisdom indicates that successful use of cemented tungsten carbide substrates may only be achieved by utilizing substrates containing no cobalt, as taught in U.S. Pat. No. 4,990,403; no more than 4% Co binder, as taught in U.S. Pat. No. 4,731,296, or by deliberately depleting the cobalt concentration at the surface of the substrate. It is known to deplete the cobalt concentration at the surface of the substrate by selective etching or other methods. (M. Yagi, *Cutting Performance of Diamond Deposited Tool for Al 18 mass % Si Alloy*, Abst. of 1st Int. Conf. on the New Diamond Sci. & Technol., pp. 158–159, Japan New Diamond Forum, (1988)), but this decreases the surface toughness of the substrate and can cause chipping of the substrate and applied diamond film. Increased adhesion of diamond to the substrate may be achieved by decarburizing the substrate prior to deposition, as taught in European Patent Application Publication No. 0 384 011, but use of this procedure does not optimize substrate toughness and does not lend itself well to manufacturing environments where repeatability and consistency are important issues. The prior art teaches polishing or scratching the surface of a cemented tungsten carbide substrate prior to attempting diamond deposition due to the enhancement of the nucleation process caused by polishing and scratching. (Haubner and Lux (supra), Yagi (supra), M. Murakawa et al., *Chemical Vapor Deposition of a Diamond Coating Onto a Tungsten Carbide Tool Using Ethanol*, Surface and Coatings Technology, Vol. 36, pp. 303–310, 1988; Kuo, et al., *Adhesion and Tribological Properties of Diamond Films on Various Substrates*, J. Mat. Res., Vol. 5, No. 11, November 1990, pp. 2515–2523.) These articles either teach the use of polished substrates or indicate poor results obtained by utilizing substrates whose surfaces have not been prepared by polishing or scratching. A promising solution to the adhesion problem has been to employ an interlayer between the diamond coating and the WC/Co substrate. This encapsulates the Co, optimizing adhesion while allowing the substrate to retain its toughness. It may also be possible to choose an effective interlayer material that bonds strongly to diamond coating, further increasing adhesion. U.S. Pat. No. 4,707,384 discloses the use of a titanium carbide interlayer. U.S. Pat. Nos. 4,998,421 and 4,992,082 disclose the utilization of a plurality of layers of separated diamond or diamond like particles interposed with layers of a planarized bonding material.

Another solution to the adhesion problem is disclosed in U.S. Pat. No. 5,236,740 issued Aug. 17, 1993 to Peters et al., wherein some of the tungsten carbide at the surface of a cemented tungsten carbide article is etched away without removing any cobalt binder, and then in a second etching step the residue from the first etching step is removed after which a diamond coating is applied. The first etching step requires the use of a strong base combined with a cyanide compound, and the second etching step requires the use of a strong acid combined with a strong oxidizing compound.

It is also generally known in the cemented carbide industry that ferric chloride ($FeCl_3$) solutions will dissolve cobalt via the oxidation-reduction reaction $Co + 2Fe^{+3} \rightarrow Co^{+2} + 2Fe^{+}$ 2. However, the rate of reaction, and most importantly, the uniformity of the depth of reaction around an insert were not known.

General references regarding the chemical etchants for tungsten carbide and tungsten alloys include *Annual Book of ASTM Standards, Part II, Metallography; Non-destructive Testing*, American Society for Testing and Materials, page 60 (etching reagent consisting of a mixture of 10 wt. %

NaOH and 30 wt. % $H_2O_2$ in a 2:1 ratio) & page 439 (various combinations of acids for use as etchants—HF/$HNO_3$/$H_2O$, HF/$HNO_3$/HCl and HF/$HNO_3$/lactic acid), (1979), and *Metals Handbook*, Vol. 8, American Society for Metals, 8th edition, page 109 (1973).

It would, however, be advantageous to develop methods to provide for the optimum direct diamond coating of a cemented tungsten carbide article having superior adhesion for machining purposes without the need to utilize cyanide components in the process. Tools of such diamond coated cemented tungsten carbide articles would also be desirable.

OBJECTS AND SUMMARY OF THE INVENTION

One object of the present invention is to provide a process of producing an adherent diamond film on a cemented metal carbide substrate.

Another object of the present invention is to provide an adherent diamond film on a cemented metal carbide substrate without the need to use cyanide compounds and strong acids.

Yet another object of the present invention is to produce improved adherent diamond film coated cemented metal carbide substrates which may be utilized as metal cutting tool inserts.

Still yet another object of the present invention is to produce improved adherent diamond film coated cemented metal carbide substrates which may be utilized as metal cutting tool inserts comprising preformed chip control geometries.

Accordingly, one form of the present invention relates to a process for coating cemented metal carbide substrates with a diamond film, comprising the steps of: performing a first etching step comprising etching a cemented metal carbide substrate in a first chemical system which selectively removes a portion of the cobalt binder; cleaning the etched surface of the cemented metal carbide substrate of said first etching step; performing a second etching step comprising etching the cemented metal carbide substrate of the first cleaning step in a second chemical system which selectively removes any surface metal carbide grains, while providing substantially no etching of the cobalt binder, further characterized in that said second chemical system consists of an oxygen-containing anion; cleaning the etched surface of the cemented metal carbide substrate of said second etching step; depositing a substantially continuous diamond film on a desired portion of said surface of said cemented metal carbide substrate of the second cleaning step.

Another form of the invention relates to a process for coating ground cemented metal carbide substrates with a diamond film, comprising the steps of: performing a first etching step comprising etching a cemented metal carbide substrate in a first chemical system which selectively removes a portion of the cobalt binder; cleaning the etched surface of the cemented metal carbide substrate of said first etching step; performing a second etching step comprising etching the cemented metal carbide substrate of the first cleaning step in a second chemical system which selectively removes any surface metal carbide grains, while providing substantially no etching of the cobalt binder, further characterized in that said second chemical system consists of an oxygen-containing anion; cleaning the etched surface of the cemented metal carbide substrate of the second cleaning step; depositing a substantially continuous diamond film on a desired portion of said surface of said cemented metal carbide substrate of the second cleaning step.

Yet another form of the present invention relates to a process for coating ground cemented tungsten carbide substrates with a diamond film, comprising the steps of: performing a first etching step comprising etching a cemented tungsten carbide substrate in a first chemical system which selectively removes a portion of the cobalt binder; cleaning the etched surface of the cemented tungsten carbide substrate of said first etching step; performing a second etching step comprising etching the cemented tungsten carbide substrate of the first cleaning step in a second chemical system which selectively removes any surface tungsten carbide grains, while providing substantially no etching of the cobalt binder, further characterized in that said second chemical system consists of an oxygen-containing anion; cleaning the etched surface of the cemented tungsten carbide substrate of said second etching step; depositing a substantially continuous diamond film on a desired portion of said surface of said cemented tungsten carbide substrate of the second cleaning step.

Still another form of the present invention relates to the product produced according to the process of the present invention.

Yet still another form of the present invention relates to a metal cutting insert produced according to the process of the present invention.

Preferred forms of the invention, as well as other embodiments, objects, features and advantages of this invention, will be apparent from the following detailed description which is to be read in connection with the accompanying drawings.

DESCRIPTION OF THE PREFERRED EMBODIMENTS OF THE INVENTION

The present invention will be better understood from the specification taken in conjunction with the accompanying examples.

Figure 1:
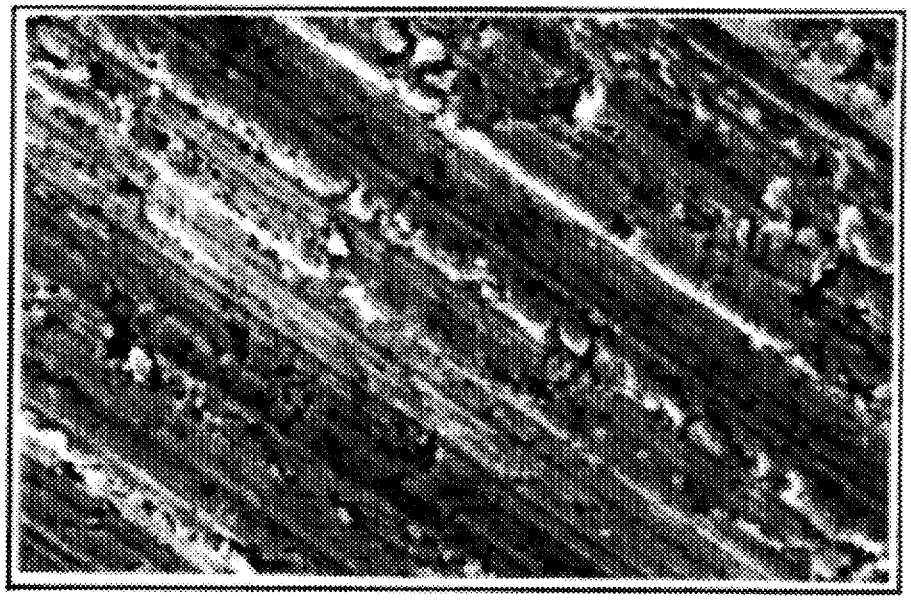
FIG. 1 is an SEM photomicrograph of a ground WC-6 wt. % Co insert (5000×).

In the process of grinding cemented carbide inserts a great deal of damage to the surfaces is produced. FIG. 1 is a typical ground surface when viewed perpendicular to the surface at approximately 5000× magnification with a scanning electron microscope. One can see grind marks, some rather featureless areas consisting of truncated or fragmented WC grains, and some areas where "pull-out" of the grains has occurred. It is only in the latter areas that the deposited diamond film can adhere to the carbide substrate. While not wishing to be limited to any one theory, it is believed that the damaged metal carbide grains in the top several microns of the ground insert surface need to be removed to expose well defined metal carbide grains which will allow one to achieve mechanically anchored, and hence adherent, diamond films.

Figure 2:
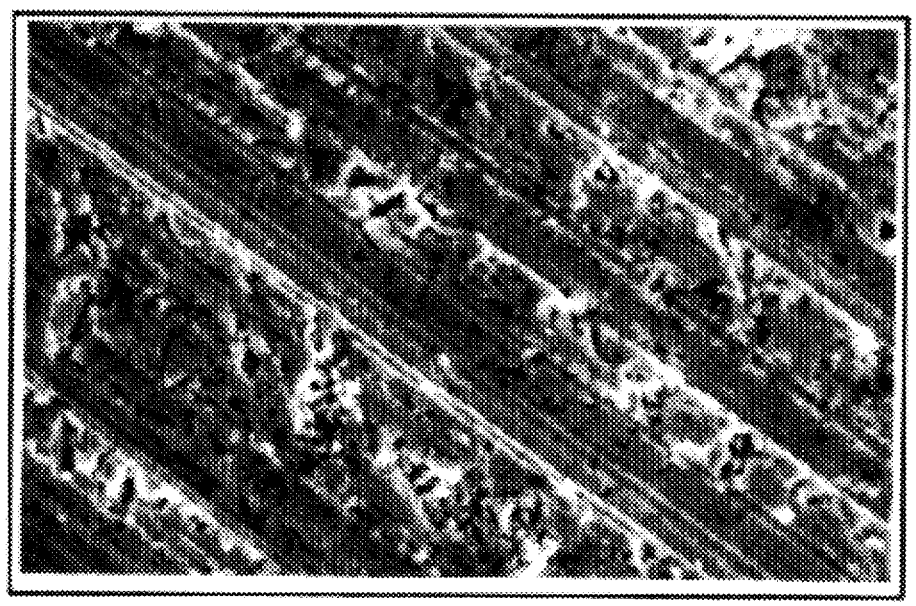
FIG. 2 is an SEM photomicrograph of a ground WC-6 wt. % Co insert treated in 0.05M $FeCl_3$ for 1.5 minutes, followed by ultrasonic cleaning (5000×).

It has now been surprisingly found that the desired removal of surface grains of tungsten carbide and the subsequent deposition of an adherent diamond film can be achieved through a multi-step process. Generally, first the surface onto which the deposition of an adherent diamond film is desired is treated with a first chemical system which selectively removes the cobalt binder to a desired depth. It has been surprisingly found that treatments with ferric chloride, using the principle of oxidation-reduction give consistent and uniform cobalt removal to the desired depth. FIG. 2 is an SEM photomicrograph at a magnification of 5000× of a ground cemented tungsten carbide insert having 6 wt. % cobalt after treatment with a first chemical system comprising an aqueous solution of 0.05M $FeCl_3$ for 1.5 minutes, followed by ultrasonic cleaning. Even though the cobalt binder has been etched to a depth of approximately 3 microns, there is very little change to the surface. The WC grain have not been noticeably loosened, due presumably to the intimate interlocking of the grains. The etching of the cobalt binder to a specific depth prevents the graphitization of the deposited diamond film. The etching of the cobalt binder in the first step provides another benefit in that the tungsten carbide grains are exposed to the second chemical system, and allows that reaction to proceed more rapidly.

Figure 3:
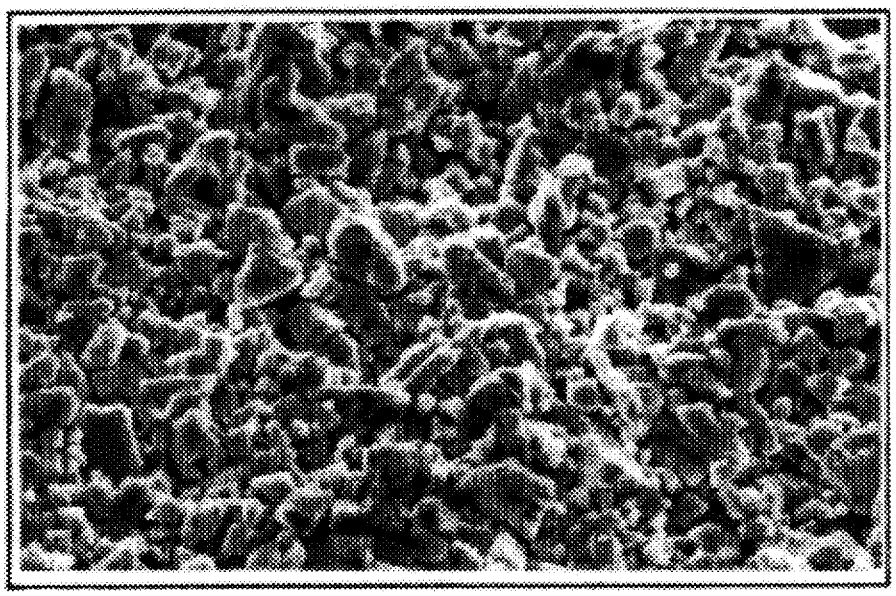
FIG. 3 is an SEM photomicrograph of a ground WC-6 wt. % Co insert, after treatment in a 0.05M $FeCl_3$ solution for 1.5 minutes, followed by treatment in a 10 wt. % NaOH (75 ml)/30 wt. % $H_2O_2$ (37.5 ml), initially at 50° C., for 3 minutes (5000×).

Next, surface grains of tungsten carbide are selectively removed to a desired depth by utilizing a second chemical system which is further characterized as consisting of an oxygen-containing anion. FIG. 3 is an SEM photomicrograph at a magnification of 5000× of a ground tungsten carbide insert having 6 wt. % cobalt after treatment in an aqueous solution of 0.05M $FeCl_3$ for 1.5 minutes, followed by treatment in a 10 wt. % NaOH (75 ml)/30 wt. % $H_2O_2$ (37.5 ml) solution, initially at 50° C., for 3 minutes. As a result of such treatment, well-defined tungsten carbide grains, as seen in FIG. 3, were exposed. This morphology resulted in improved mechanical anchoring, and hence improved adhesion, of the deposited diamond film.

Finally, the desired film is deposited upon the hereinabove prepared surface using known diamond deposition procedures, especially CVD deposition procedures.

According to one preferred aspect of the present invention, a method is described for preparing a cemented tungsten carbide substrate for coating with a layer of diamond film. In practice a cemented tungsten carbide substrate is etched in a first chemical system comprising a solution of $FeCl_3$ (ferric chloride) at room temperature. The exposed tungsten carbide grains, which are now free of cobalt binder, are then etched using a second chemical system, characterized as consisting of an oxygen-containing anion, to remove these tungsten carbide grains and expose as many tungsten carbide surfaces suitable for diamond film nucleation sites as possible. Finally, the diamond film is deposited onto the prepared surface of the tungsten carbide substrate.

In one preferred embodiment of the present invention, the cemented tungsten carbide substrates are rinsed in deionized water, ultrasonically cleaned in deionized water, ultrasonically cleaned in ethyl alcohol and then air dried after each etching step.

Cemented tungsten carbide substrates which are suitable for use in the present invention are those containing up to 30% by weight of cobalt, preferably, those containing from about 1% to about 16%, and most preferably those containing from about 3% to about 6% by weight of cobalt. These types of cemented tungsten carbide substrates are generally associated with cutting tools but may be used for any suitable purpose.

It has been surprisingly found that a first etching step comprising etching in a first chemical system comprising a solution of a $FeCl_3$ at room temperature does not substantially attack the metal carbide grains but does provide for the selective removal of the cobalt. Those skilled in the art will recognize that the depth of etching of the cobalt will depend upon the molarity of the $FeCl_3$ solution, the temperature, the reaction time and the substrate composition (i.e., cobalt content, binder chemistry and carbide grain size), so that some reaction experimentation is expected prior to industrial applications to define optimum parameters. The strength of the cutting edge is reduced due to etching of cobalt and therefore control of depth of etch is important. Certain machining operations such as milling which involve impact will benefit from a shallower depth of etch as compared to less severe operations such as straight turning which may be able to tolerate a deeper etch. The presently preferred solutions are about 0.05M and about 0.10M $FeCl_3$ aqueous solution, but other concentrations known in the art may also be used. The criterion is to reach a desired depth of cobalt removal in an acceptable time period and in a reproducible manner, such criteria being well known in the art. The depth of cobalt removal is up to from about 2 microns to about 12 microns, and preferably from about 3 to about 10 microns. An approximately 3 micron depth of cobalt removal may be realized by immersing the selected cemented tungsten carbide substrate in a 0.05M $FeCl_3$ aqueous solution for 1.5 minutes at room temperature in the case of a grade C2 carbide, for example. Those skilled in the art will recognize that the preferred depth of cobalt removal is dependent upon the end use to which the cemented substrate will be put, and the ranges given herein are not to be construed as limiting, but rather are merely illustrative of use as a cutting tool. The concentration of $FeCl_3$ is in the range of from about 0.01M to about 1M, depending upon preferred reaction times, temperatures and amount of cobalt to be removed from the substrate. Those skilled in the art will recognize that the chosen molarity of the $FeCl_3$ solution will depend on the temperature, reaction time, and substrate composition (i.e., cobalt content, binder chemistry and carbide grain size), so that some reaction experimentation is expected prior to industrial applications to define optimum parameters. The presently preferred solutions are about 0.05M and about 0.10M $FeCl_3$ aqueous solution, but other concentrations known in the art may also be used.

Other chemical systems which have been found suitable for use in the first etching step include sodium persulfate ($Na_2S_2O_8$), sodium tetrafluoroborate ($NaBF_4$), sodium citrate ($Na_3C_6H_5O_7.2H_2O$), sodium pyrophosphate ($Na_4P_2O_7.10H_2O$), boric acid ($H_3BO_3$), potassium sodium tartrate (($KOOC$) $(CHOH)_2(COONa).4H_2O$), ammonium hydroxide ($NH_4OH$), acetic acid ($HC_2H_3O_2$), ammonium fluoride ($NH_4F$), sodium dithionite ($Na_2S_2O_4$), sodium triphosphate ($Na_5P_3O_{10}$) and combinations thereof. These chemical systems all etch the cobalt binder substantially without attacking the metal carbide grains.

The criterion is to reach a desired depth of cobalt removal in an acceptable time period and in a reproducible manner, such criteria being well known in the art. Those skilled in the art will recognize that the preferred depth of cobalt removal is dependent upon the end use to which the cemented substrate will be put, and the ranges given herein are not to be construed as limiting, but rather are merely illustrative of use as a cutting tool insert.

Concentrations of the chemical systems and the times and temperatures of the reactions may be easily determined by those skilled in the art without undue experimentation to meet desired operating parameters.

The discovery of suitable chemical compounds for use as the second chemical system to selectively etch metal carbide grains began with the known compounds for the etching of tungsten carbide and tungsten alloys in the hereinabove described references [Annual Book of ASTM Standards, Part II, Metallography; Non-destructive Testing, American Society for Testing and Materials, at page 60 and at page 439, and Metals Handbook, Vol. 8, American Society for Metals, 8th edition, at page 109]. However, it was quickly ascertained that strong acids (HCl, $HNO_3$, and HF, and combinations thereof, for example) while indeed dissolving tungsten carbide, also dissolved the cobalt binder, and at a much more rapid rate. For example, complete removal of damaged tungsten carbide grains from the surface of a ground WC-6 wt. % Co (C2 carbide) insert using a solution of 1 part HF/5 parts $HNO_3$/12 parts $H_2O$ at room temperature took only 11 minutes but etched the cobalt to a depth of 55 microns. It was also observed that the chemical attack on the cobalt binder was quite non-uniform. The use of $NaOH/H_2O_2$ solutions, however, proved to selectively attack tungsten carbide, but this reference did not teach how to utilize this to provide a metal carbide substrate capable of having an adherent diamond film deposited thereupon.

The presently preferred second etching step comprising etching in a second chemical system comprising a 2:1 ratio of 10 wt. % NaOH and 30 wt. % $H_2O_2$ solution used at room temperature of about 20° C. for greater than about 5 minutes, and preferably 15 to 60 minutes. Longer etching times are possible, but are limited by the reactivity of the mixture. Other chemical systems which have been found suitable for use in the second etching step include aqueous solutions of hydrogen peroxide ($H_2O_2$), sodium perborate ($NaBO_3.4H_2O$), sodium chlorite ($NaClO_2$), tri-sodium phosphate ($Na_3PO_4.12H_2O$), sodium hydroxide (NaOH), sodium bicarbonate ($NaHCO_3$), sodium carbonate ($Na_2CO_3$), sodium metaborate ($Na_2B_2O_4.8H_2O$), sodium borate ($Na_2B_4O_7.10H_2O$), sodium nitrite ($NaNO_2$), sodium phosphate dibasic ($Na_2HPO_4.7H_2O$), sodium acetate ($NaC_2H_3O_2.3H_2O$) and combinations thereof. This second etching step removes damaged metal carbide grains with substantially no attack of the cobalt binder. Concentrations of the chemical systems and the times and temperatures of the reactions may be easily determined by those skilled in the art without undue experimentation to meet desired operating parameters.

The time of this etching step is dependent on the type of cemented tungsten carbide substrate, the solution type and the concentration used. These parameters are well understood in the art and may be ascertained by one skilled in the art without undue experimentation. In order for these chemical systems to etch the metal carbide grains efficiently, it is preferred that the cobalt be etched with the first chemical system, thus exposing the tungsten carbide grains to the second chemical system.

The use of strong acids to perform the second etching step is to be avoided because strong acids tend to remove the cobalt binder to a depth that is greater than desired to produce a strong substrate for the diamond film deposition and for use as a cutting tool insert.

These surface preparation techniques are not limited to ground cemented carbide products. It is expected that they will be suitable techniques for as-sintered cemented carbide products as well. In both situations, tungsten carbide (and solid solution carbide) grains are being removed from the surfaces; in the one case the grains are damaged, in the other they are not. Also, the substrate is not limited to tungsten carbide, but may also comprise titanium carbide, tantalum carbide, niobium carbide, vanadium carbide, and combinations thereof.

The adherent diamond film may be applied in any suitable known method. Suitable methods of applying an adherent diamond film include, but are not limited to, for example, reactive vapor deposition, thermally-assisted (hot-filament) CVD, plasma-enhanced CVD, plasma arc-jet CVD, as well as other known methods. The presently preferred method is the low-pressure plasma-enhanced CVD. The most commonly used and widely studied method is the microwave plasma-assisted CVD. The operating conditions for this method are well-known in the art. For example, the following operating conditions are successfully applied: Microwave power=300 W to 75 KW, Substrate temperature (for cemented carbide tools)=800° C. to 1200° C., Total Pressure=$10^{-2}$ torr to $10^{+2}$ torr, $CH_4/H_2$ ratio=0.1-10.0%. Total gas flow rate will depend upon the size of the deposition chamber, use of other, non-reactive gases such as argon, and the nature and growth rate of deposited film desired. Methods described in the art fall generally within these parameters and are applicable for depositing a diamond film.

Diamond films can be deposited from a variety of known carbon sources, such as aliphatic hydrocarbons and their variants which contain various amounts of other species such as oxygen, nitrogen, halogens etc. Bachmann, et al (Diamond and Related Materials, Vol. 1, 1992, p. 1) teach that while it is eminently possible to deposit a good quality diamond film from a mixture of hydrogen and methane, the operating domain of useful deposition can be enlarged by the addition of small amounts of oxygen to the gas. Indeed, practitioners of the art have used additions of gases such as pure $O_2$, CO, $CO_2$, as well as compounds such as alcohols, ketones and the like. U.S. Pat. No. 4,816,286 lists a wide range of organic compounds containing carbon and hydrogen, with optionally other elements such as oxygen, nitrogen and the like, in various states of chemical bonding. Regrettably, however, it does not conclusively demonstrate that every one of the listed compounds actually deposits diamond using any of the listed methods of deposition in their teaching. It is, therefore, left to the speculation of a practitioner to decide which of these compounds, which theoretically can produce diamond, actually do so.

It has been amply demonstrated in the art, through thermodynamic modeling methods and deposition trials, that the key ingredient in the successful deposition of diamond from the vapor-phase mixture of a hydrocarbon and hydrogen is the methyl radical, $CH_3$. Methane provides a single methyl radical during decomposition in the presence of atomic hydrogen plasma generated by the action of the microwave energy. We have surprisingly discovered that dimethyl ether, $CH_3OCH_3$, is an efficient and energetic source of two active methyl radicals, as well as providing an oxygen atom which beneficially broadens the operating range of the process. While this discovery was surprising, it was by no means unexpected, since it has been previously shown in the deposition of $W_xC$ compounds by CVD that dimethylether is indeed a better precursor than alcohols and other hydrocarbons, as taught in Bhat and Holzl, Thin Solid Films, vol. 95, 1982, p. 105, and in U.S. Pat. Nos. 4,162,345, and 4,855,188; 4,874,642; 4,910,091 and 5,024,901.

While not subscribing to any one theory, it is believed that the chemical nature of the bonds which incorporate oxygen in the alcohols, i.e., bonding on one side with carbon and on the other with hydrogen in the form of the OH radical, makes it more difficult to realize the full reactivity and energy of the broken bonds during the synthesis process. On the other hand, the oxygen in dimethylether is symmetrically bonded on both sides to carbon atoms. Thus, when the carbon-tooxygen bonds are broken, one obtains a free oxygen ion and two methyl radicals. Possible mechanisms of decomposition of methyl alcohol, ethyl alcohol and dimethylether are schematically shown below.

Decomposition of methyl alcohol ($CH_3OH$)
:$CH_3OH \rightarrow CH_3 + OH$

Decomposition of ethyl alcohol ($CH_3CH_2OH$)
:$C_3CH_2OH \rightarrow CH_3 + CH_2 + OH$ Decomposition of dimethylether ($CH_3OCH_3$)
:$CH_3OCH_3 \rightarrow 2CH_3 + O$ It can be seen that the decomposition of alcohols can lead to the release of the OH radical, which can combine during diamond deposition with atomic hydrogen which is present in the reactor. This can lead to the formation of water vapor. Condensation of water vapor in the colder regions of the reactor system can lead to operational problems. However, the use of dimethylether is advantageous in this regard. It is also advantageous over using CO, $CO_2$, or even pure oxygen because of the ease of decomposition of dimethylether. In some vacuum systems, use of oxygen can cause serious degradation of vacuum pump oil unless expensive oils are used instead of the conventional pump oil. Thus, it is found that dimethylether is an excellent source of carbon and oxygen, and allows a finer control of gas-phase chemistry and quality of diamond film. The presently preferred method is to utilize a partial pressure of dimethylether of from about 1% to about 5% in a mixture of dimethylether and hydrogen at an operating pressure of from about 10 torr to about 50 torr, and most preferably a partial pressure of from about 1.5% to about 3.0% of dimethylether at about 25 torr total pressure. Depending on the size of the deposition reactor and other operating parameters of the deposition system, other ranges of concentrations and pressures as well as other conditions will become apparent to those skilled in the art having the benefit and knowledge of conditions given heretofore. Therefore, the presently preferred conditions are not intended to be limiting the scope of this invention and other, obvious and deduced variations are intended to fall within the scope of this invention.

The following examples are intended to be illustrative of various aspects of the invention, and are not to be construed as limiting in any way the scope and spirit of the invention.

EXAMPLES

Example 1

Two C2 grade (WC-6 wt. % Co) cemented tungsten carbide cutting tool inserts were used in the as-sintered condition. Two different strength $FeCl_3$ etching solutions were prepared. One solution comprised 4.05 grams of anhydrous $FeCl_3$ dissolved in 250 ml of deionized water to provide a 0.10M solution. The second solution comprised 20.2 grams of anhydrous $FeCl_3$ was dissolved in 250 cc of deionized water to provide a 0.50M solution. One insert was treated in each $FeCl_3$ solution at room temperature for 1 minute with gentle agitation of the solution. Each insert was then rinsed in deionized water and then placed in an ultrasonic cleaning system for 10–15 seconds in a beaker containing deionized water. Finally, they were rinsed in ethyl alcohol and allowed to air dry. Each insert was then cross-sectioned and polished and examined by photomicrography. The examination of the cross-sectioned insert exposed to the 0.10M $FeCl_3$ solution showed cobalt removal to depths of approximately 2 microns, and that the cross-sectioned insert exposed to the 0.50M $FeCl_3$ solution showed cobalt removal to depths of approximately 4 microns.

Example 2

Two cemented tungsten carbide cutting tool inserts having coarse-grained tungsten carbide and 11 wt. % cobalt binder were used in the as-sintered condition. They were treated with the same $FeCl_3$ solutions and examined as the samples in Example 1. The cross-sectioned insert exposed to the 0.10M $FeCl_3$ solution showed cobalt etching to depths of approximately 3 microns and the cross-sectioned insert exposed to the 0.50M $FeCl_3$ solution showed cobalt etching to depths of approximately 10 microns.

Example 3

Figure 4:
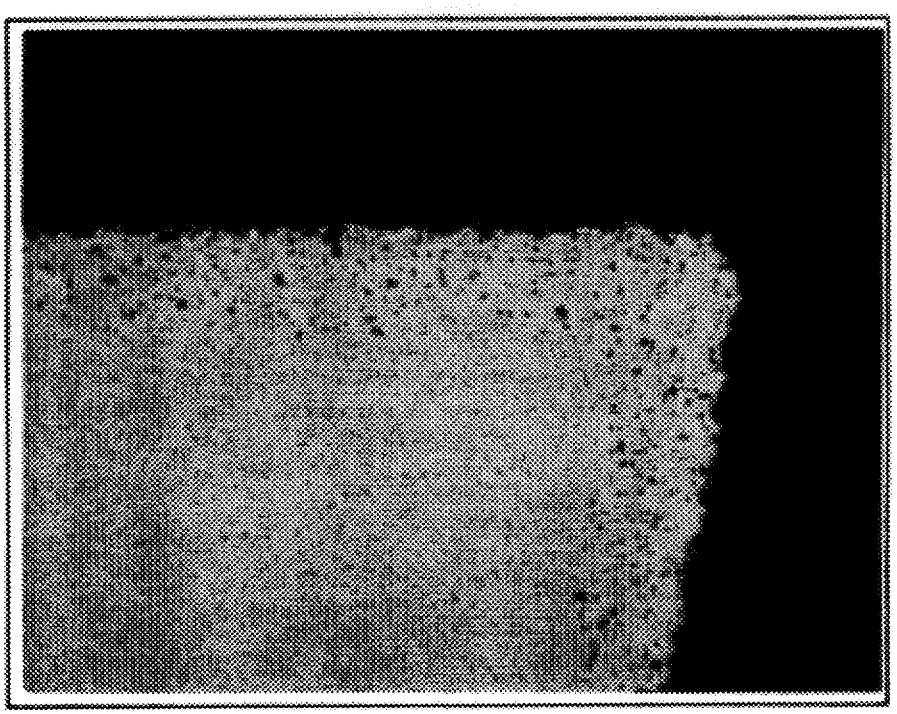
FIG. 4 is an optical photomicrograph of a cross-sectioned ground WC-6 wt. % Co insert treated in 0.05M $FeCl_3$ for 7½ minutes (1000×).

Ground C2 grade (WC-6 wt. % Co) inserts, style SPG422, from a lot of 200 inserts, were treated in a freshly prepared 0.05M $FeCl_3$ solution. The solution was prepared by adding 3.35 grams of $FeCl_3.6H_2O$ to 250 ml of de-ionized water. The inserts were etched for times of 1, 2, 3, 4, 5, 7½ and 10 minutes with gentle agitation of the solution. The subsequent processing steps were as described in Example 1. The depths of etch were found to be 2, 3–4, 5–6, 7–8, 9–10, 14–15 and 18–20 microns, respectively. The depth of cobalt etch was shown to be linear with time. Also, the depth of etch was remarkably uniform around the exposed surfaces of any given insert. A photomicrograph of the cross-sectioned insert treated for 7½ minutes is shown in FIG. 4.

The following experiments illustrate additional chemical systems which are suitable for selectively etching the cobalt binder of a cemented metal carbide insert. All of the examples utilized cemented tungsten carbide inserts, style SPG 422, C2 grade, from a lot of 200 ground inserts all comprising tungsten carbide with 6 wt. % Co binder.

Examples 4–14

Inserts from the batch of 200 were treated with various chemical systems that were found to be capable of selectively etching the cobalt binder without attacking the tungsten carbide grains. In each case the inserts were treated in an aqueous solution using deionized water and after treatment cross-sectioning was performed to allow optical microscopic examination of the treated inserts. The specific chemical systems, experimental conditions, and the results of the chemical treatments are summarized in Table 1 below.

TABLE 1

Summary of Cobalt Binder Etching Systems

| Chemical | Conc. | Depth of Cobalt Etch | Time of Reaction | Temperature of Reaction |
|---|---|---|---|---|
| Sodium persulfate $Na_2S_2O_8$ | 10 wt. % | 250 microns | 8 hours | 75° C. |
| Sodium tetrafluoroborate $NaBF_4$ | 3.3 wt. % | 66 microns | 14 hours | 75° C. |
| Sodium citrate $Na_3C_6H_5O_7.2H_2O$ | 10 wt. % | 35 microns | 17 hours | 75° C. |
| Sodium pyrophosphate $Na_4P_2O_7.10H_2O$ | 6.7 wt. % | 19 microns | 15 hours | 75° C. |
| Boric acid $H_3BO_3$ | 5 wt. % | 17 microns | 14 hours | 75° C. |
| Potassium Sodium tartrate (KOOC)(CHOH)$_2$(COONa).4H$_2$O | 10 wt. % | 6 microns | 15 hours | 75° C. |
| Ammonium hydroxide $NH_4OH$ | 10 vol. % | 20 microns | 3 days | Room Temp. |
| Acetic acid $HC_2H_3O_2$ | 10 vol. % | 30 microns | 5½ days | Room Temp. |
| Ammonium fluoride $NH_4F$ | 10 wt. % | 8 microns | 2 days | Room Temp. |

TABLE 1-continued

Summary of Cobalt Binder Etching Systems

| Chemical | Conc. | Depth of Cobalt Etch | Time of Reaction | Temperature of Reaction |
|---|---|---|---|---|
| Sodium dithionite $Na_2S_2O_4$ | 5 wt. % | 80 microns | 22 days | Room Temp. |
| Sodium tri-phosphate $Na_5P_3O_{10}$ | 5 wt. % | 70 microns | 20 days | Room Temp. |

Examples 15–29

We searched for chemical systems that would remove the surface tungsten carbide grains from ground carbide substrates without substantially attacking the cobalt binder. Relatively inexpensive and safe chemical systems were pursued. Inserts from a batch of 200 ground, unhoned, WC-6 wt. % Co (C2) inserts were used in these exploratory studies.

In order to assess the many chemical systems that were attempted, and then to rank the successful ones, we adopted a cobalt etching procedure consisting of freshly prepared 0.05M $FeCl_3$ solutions for 1.5 minutes which gave a depth of etch of approximately 3 microns. After ultrasonic cleaning, rinsing and drying, the insert was weighed.

In each case the inserts were treated one at a time in an aqueous solution using de-ionized water. The progress of the reaction was monitored at appropriate intervals by removing the insert from the test solution and placing it in an ultrasonic cleaning system for 10–15 seconds in a beaker containing de-ionized water. Debris was usually seen coming off the insert especially during the first time in the ultrasonic cleaning system. After rinsing and drying of the insert the weight loss was recorded. From optical examination of the top rake face at approximately 100×, an estimate could be made of the amount of the original surface that had been removed. Examination at approximately 700× allowed the quality of the individual grains to be assessed.

The insert was returned to the test solution, and the process continued until the original surface had been removed. At this point, optical examination at approximately 700× revealed well-defined WC grains over the entire surface. Examination at 5000× in a scanning electron microscope revealed surfaces that were essentially identical to that shown in FIG. 4.

Cross-sectioning of the insert was then performed in order to determine if additional etching of the cobalt binder had occurred.

Insert weight losses were typically 4.0 mg for those situations where complete removal of the surface had occurred. It was instructive to perform a simple calculation. A weight loss of 4.0 mg corresponded to a volume loss of 0.000256 $cm^3$, using the density of WC equal to 15.6 $g/cm^3$. Since the exposed surface area of a SPG422 insert (top rake face and the four flank faces) was 3.22 $cm^2$, the thickness of WC removed was 0.000080 cm or 0.8 microns.

The successful chemical systems, experimental conditions, and the results of the treatments are summarized in Table 2 below.

TABLE 2

Summary of Tungsten Carbide Etching Systems

| | | Time Required to Remove Damaged WC Grains | | |
|---|---|---|---|---|
| Chemical | Conc. | Room Temp. | 50° C. | 75° C. |
| Hydrogen peroxide/Sodium hydroxide $H_2O_2$/NaOH | 30/10 wt. % 1:2 ratio 37.5 ml/ 75 ml | 11½ minutes | 3 minutes | — |
| Hydrogen peroxide $H_2O_2$ | 50 wt. % | 75 minutes | 5 minutes | 50 seconds |
| Hydrogen peroxide $H_2O_2$ | 30 wt. % | 115 minutes | 8 minutes | 72 seconds |
| Hydrogen peroxide $H_2O_2$ | 3 wt. % | 4½ hours | 24 minutes | 5½ minutes |
| Sodium perborate $NaBO_3.4H_2O$ | 3.5 wt. % | 95 minutes | 50 minutes | 10 minutes |
| Sodium chlorite $NaClO_2$ | 5 wt. % | 5½ hours | 125 minutes | 9 minutes |
| Tri-sodium phosphate $Na_3PO_4.12H_2O$ | 10 wt. % | 6 days | — | 6 hours |
| Sodium hydroxide NaOH | 10 wt. % | 10 days | — | 56 hours* |
| Sodium bicarbonate $NaHCO_3$ | 8.6 wt. % | 20 days** | — | 10 hours |
| Sodium carbonate $Na_2CO_3$ | 6.7 wt. % | 21 days | — | 13 hours |
| Sodium metaborate $Na_2B_2O_4.8H_2O$ | 10 wt. % | 30 days | — | 16 hours |
| Sodium borate $Na_2B_4O_7.10H_2O$ | 6.7 wt. % | (50% complete in 50 days) | — | 16 hours |
| Sodium nitrite $NaNO_2$ | 5 wt. % | (40% complete in 50 days) | — | 16 hours |
| Sodium phosphate dibasic $Na_2HPO_4.7H_2O$ | 5 wt. % | — | — | 23 hours |
| Sodium acetate $NaC_2H_3O_2.3H_2O$ | 25 wt. % | — | — | 29 hours |

*Etching of the cobalt binder has also occurred; final depth 16 microns.
**Etching of the cobalt binder has also occurred; final depth 5 microns.

Some comments about the $H_2O_2$/NaOH system are in order. After several experiments had been performed it became clear that the extent of the reaction of the surface tungsten carbide depended on the amount of $H_2O_2$ in the mixture, and that once the $H_2O_2$ was consumed, there was no further reaction. Thus, for these exploratory experiments, we settled on 75 ml of NaOH and 37.5 ml of $H_2O_2$ as the components of the 2:1 10 wt. % NaOH/30 wt. % $H_2O_2$ mixture.

Also, the reaction between this mixture and cemented carbides was found to be quite exothermic. For example, with one SPG422 insert placed in the above solution initially at room temperature, the temperature and the bubbling activity at the insert surface increased over the next few minutes. At the 3-minute mark the bubbling was so vigorous it could best be described as "frothing", which rose to a height of about one inch in the 500 ml beaker. The temperature at this point was approximately 60° C. The temperature of the solution continued to rise to 68° C. at the 4½-minute mark while the "frothing" decreased. The bubbling at the insert surfaces was still quite vigorous. The temperature slowly fell to approximately 50° C. at the 15-minute mark, and bubbling was still occurring at the insert surfaces.

If larger quantities of inserts are to be treated by this procedure, then, clearly, the extent of removal of the surface WC grains will depend upon the number of inserts, size of the inserts, volume and concentration of $H_2O_2$, volume and concentration of NaOH, initial temperature, temperature excursions and time.

Solutions of sodium peroxide ($Na_2O_2$) and water are expected to behave in a similar manner as mixtures of $H_2O_2$ and NaOH, because sodium peroxide reacts with water to produce $H_2O_2$ and NaOH.

None of the other systems, including hydrogen peroxide solutions, exhibited any temperature increases during WC-surface removal.

All of the second chemical systems set forth herein gave rise to surface morphologies essentially identical to that shown in FIG. 3. It is reasonable to expect that all such treated substrates would, when subjected to diamond deposition, give rise to adherent diamond films.

Example 30

A C2 insert from the 200-insert lot was treated in a freshly prepared 0.05M $FeCl_3$ solution for 1.5 minutes. It was weighed and then subjected to a 10 wt. % NaOH(75 ml)/30 wt. % $H_2O_2$ (37.5 ml) solution. The temperature rise, the "frothing", and the temperature fall have been described earlier. After 15 minutes, the insert was ultrasonically cleaned, rinsed and dried. The weight loss was found to be 5.1 mg, which was more than the weight loss required to just remove the damaged surface WC grains. Examination at 100× showed that all the grind marks had vanished, and at 750×, well-defined WC grains were visible. Cross-sectioning showed traces of the original depth of etch of the cobalt.

Another C2 insert from the same lot was treated exactly as described above, except that the insert was left in the solution for 3 hours, rather than 15 minutes. At the end of this time the weight loss was found to be 5.3 mg. There was complete removal of the original surface when examined at 100×, and well-defined WC grains could be seen at 750×. Cross-sectioning again showed that traces of the original etch.

Thus, in the first case the reaction continued until essentially all of the $H_2O_2$ had been exhausted from the solution. Leaving the insert in the solution for several more hours did not cause additional attack of the tungsten carbide or of the cobalt.

Examples 31-34

These four examples demonstrate that the loss of weight of the cemented carbide insert depends on the amount of $H_2O_2$ in the NaOH/$H_2O_2$ mixture. In all four experiments a 2:1 ratio of 10 wt. % NaOH and 30 wt. % $H_2O_2$ was used on samples as used in the previous examples and treated in freshly prepared 0.05M $FeCl_3$ solutions for 1.5 minutes. The time required for the bubbling to cease was determined, and the weight losses were measured. The only difference in the four examples were the volumes of the components. Example 31 used 75 ml of NaOH and 37.5 ml of $H_2O_2$, Example 32 used one quarter of these quantities, Example 33 used one half these quantities, and Example 34 used twice these quantities. The results are summarized below in Table 3.

TABLE 3

| Example No. | Mixture Ratio | Vol. of Components (10% NaOH/30% $H_2O_2$) | Time Required for Bubbling to Cease | Weight Loss |
|---|---|---|---|---|
| 31 | 2:1 | 75 ml/37.5 ml | 49 minutes | 0.0065 grams |
| 32 | 2:1 | 18.7 ml/9.3 ml | 18 minutes | 0.0024 grams |
| 33 | 2:1 | 37.5 ml/18.7 ml | 21 minutes | 0.0047 grams |
| 34 | 2:1 | 150 ml/75 ml | 68 minutes | 0.0073 grams |

In the Example 32, only 50–60% of the original surface had been removed, and this was reflected in the weight loss. In the other three experiments there was sufficient $H_2O_2$ in the solutions to more than completely remove the original damaged surfaces.

Examples 35-36

Studies were performed with mixtures other than the usual 2:1 ratio of 10 wt. % NaOH and 30 wt. % $H_2O_2$. We arbitrarily chose a 5:1 ratio using 250 ml of NaOH and 50 ml of $H_2O_2$. A ground WC-6 wt. % Co insert from the usual source was treated in a freshly prepared 0.05M $FeCl_3$ solution for 1.5 minutes and then weighed. The temperature of the solution (both components were at 21° C. initially) rose very rapidly to 32° C., and there was vigorous bubbling at the insert surfaces. The temperature of the solution slowly rose to 38° C. and then slowly fell to 30° C. over the duration of the experiment (70 minutes). Approximately every 10 minutes the insert was transferred to a smaller beaker of de-ionized water and placed in the ultrasonic cleaner for 10–15 seconds.

At the 70-minute mark the weight loss was found to be 4.1 mg and there was complete removal of the original ground surface. Cross-sectioning showed traces of the original etch; i.e., no additional etching of the cobalt occurred.

We also arbitrarily chose a 2:30 ratio, using volumes of 7 ml of NaOH and 105 ml of $H_2O_2$. A ground insert from the usual source was treated in a freshly prepared 0.05M $FeCl_3$ solution for 1.5 minutes and then weighed. The temperature of the solution slowly increased to 33° C., and the bubbling activity also slowly increased until the experiment was stopped at the 105-minute mark. The weight loss was 4.0 milligrams, and there was essentially complete removal of the original ground surface. Cross-sectioning again showed traces of the original etch.

Clearly, the extent of removal of the surface WC grains depended upon the number of inserts, size of inserts, volume and concentration of $H_2O_2$, volume and concentration of NaOH, temperature, temperature excursions and time.

Examples 37-38

Etching of the cobalt binder to a specific depth prevents the graphitization of the subsequently deposited diamond film. These examples show that etching of the cobalt binder in the first step provides another benefit in that the tungsten carbide grains are exposed to the etchant in the next step, and allows that reaction to proceed more rapidly.

In one experiment a C2 insert from the same source as the previous examples was treated in a freshly prepared 0.05M $FeCl_3$ solution for the usual 1.5 minutes. The insert was weighed after rinsing, ultrasonic cleaning and drying. It was then placed in a beaker containing 50 ml of 30% $H_2O_2$ at 21° C. The progress of the reaction was monitored after 100, 110 and 115 minutes. Complete removal of the surface WC grains had occurred at that point as judged by optical examination of the insert. The weight loss was found to be 4.0 mg.

In another experiment, a C2 insert from the same source was weighed after cleaning in ethyl alcohol. It was not treated in a ferric chloride solution. It was placed in a beaker containing 50 ml of 30 wt. % $H_2O_2$ at 21° C. The progress of the reaction was monitored after 120, 140, 160 and 170 minutes. Complete removal of the WC grains occurred after 170 minutes as judged by optical examination. The weight loss at this point was also found to be 4.0 mg.

Thus, etching first with ferric chloride solution substantially reduced the time required to completely remove the original ground surface.

Examples 39–43

These examples show the applicability of the present invention for use with cemented metal carbide substrates having a wide range of cobalt binder content. The substrate samples had compositions of tungsten carbide-3 wt. % cobalt, fine grained tungsten carbide-6 wt. % cobalt, tungsten carbide-6 wt. % cobalt of the same grain size as the substrates described in the hereinabove examples, tungsten carbide-10 wt. % cobalt, and tungsten carbide-16 wt. % cobalt, respectively. Each sample was cleaned and then etched in 0.05M $FeCl_3$ solutions to produce an etching depth of 3–4 microns in a similar manner to that described in the above examples. The times necessary to produce these depths of etch were 1, 1, 1½, 2, and 4 minutes, respectively, for the five samples. The samples were cleaned, dried and reweighed. Next, each sample was treated in a 6.7 wt. % sodium carbonate solution (20.1 grams of $Na_2CO_3$ in 300 grams of de-ionized water) at 75° C. Each sample was occasionally transferred to a beaker containing de-ionized water and placed in the ultrasonic cleaner. The process was continued until the original ground surfaces were just removed. The times required to remove the damaged WC grains were 35, 17, 13½, 8, and 4 hours, respectively, for the five samples. The results are summarized in Table 4 below.

TABLE 4

Weights and Weight Losses of WC—Co Compositions After Treatments in $FeCl_3$ and Hot $Na_2CO_3$ Solutions

| Composition | Weight (grams) | Weight after $FeCl_3$ Treatment (grams) | Weight Loss (grams) | Weight after $Na_2CO_3$ Treatment (grams) | Weight Loss (grams) |
|---|---|---|---|---|---|
| WC—3 wt % Co | 7.0540 | 7.0533 | 0.0007 | 7.0491 | 0.0042 |
| WC—6 wt % Co (fine grain) | 6.8648 | 6.8637 | 0.0011 | 6.8605 | 0.0032 |
| WC—6 wt % Co | 6.9268 | 6.9257 | 0.0011 | 6.9229 | 0.0028 |
| WC—10 wt % Co | 6.7304 | 6.7285 | 0.0019 | 6.7241 | 0.0044 |
| WC—16 wt % Co | 6.4682 | 6.4634 | 0.0048 | 6.4608 | 0.0026 |

The cobalt losses which occurred after the $FeCl_3$ treatments are understandable. For approximately the same etching depth, one would expect the weight loss for WC-3 wt. % Co to be the lowest and that for WC-16 wt. % Co to be the highest.

The weight losses associated with the dissolution of the surface WC grains were found to be approximately the same. The average weight loss of 3.4 mg corresponds to a volume loss of 0.00022 $cm^3$, using the density of WC equal to 15.6 $g/cm^3$. Since the exposed surface area of the sample substrates was 3.22 $cm^2$, the average thickness of WC removed during the hot sodium carbonate treatment was 0.000068 cm or approximately 0.7 microns.

Examples 44–46

These examples show the applicability of the present invention for use with cemented metal carbide containing solid solution carbides. The substrate samples had compositions of 6.0 wt. % Co, 6.0 wt. % TaC, balance WC (style SPG 432); 6.0 wt. % Co, 15.0 wt. % TaC, 12.0 wt. % TiC, balance WC (dimensions ½x½x0.260 inches); and 9.8 wt. % Co, 14.8 wt. % TaC, 6.5 wt. % TiC, balance WC (style SPG 422). Each sample was cleaned and then etched in 0.05M $FeCl_3$ solutions and produced an etching depth of 3–4 microns in a similar manner to that described in the above examples. The time necessary to produce this depth of etching was 1½, 1½, and 2 minutes, respectively, for the three samples. The samples were cleaned, dried and re-weighed. Next, each sample was treated in a 6.7 wt. % sodium carbonate solution (20.1 grams of $Na_2CO_3$ in 300 grams of de-ionized water) at 75° C. Each sample was occasionally transferred to a beaker containing de-ionized water and placed in the ultrasonic cleaner. The process was continued until the original ground surfaces were just removed as evidenced by examination at 750x using an optical microscope and at 10,000x using a scanning electron microscope which showed well defined tungsten carbide and solid solution carbide grains. The times required to remove the damaged WC grains were 15, 13, and 5 hours, respectively, for the three samples. The results are summarized in Table 5 below.

TABLE 5

Weights and Weight Losses of WC-Solid Solution Carbide Compositions after Treatments in $FeCl_3$ and Hot $Na_2CO_3$ Solutions

| Composition | Weight Loss after $FeCl_3$ Treatment (milligrams) | Weight Loss after $Na_2CO_3$ Treatment (milligrams) |
|---|---|---|
| WC-6 wt % Co-6 wt % TaC | 1.8 | 2.9 |
| WC-6 wt % Co-15 wt % TaC-12 wt % TiC | 2.6 | 2.5 |
| WC-9.8 wt % Co-14.8 wt % TaC-6.5 wt % TiC | 2.7 | 1.2 |

In summary, the two step etching method of the present invention removed the surface and/or damaged carbide grains from the surfaces of a wide range of cemented carbide compositions. Further, the presence of solid solution carbide grains appeared to have negligible influence on the time required to accomplish this surface grain removal goal.

Example 47

Ten tool inserts of grade C2 (nominal composition 94 wt. % WC-6 wt. % Co), style SPG 422, were etched in a 1000 ml quantity of freshly prepared solution of 0.1M $FeCl_3$ with constant stirring to give a depth of etch of 4–5 microns. This was followed by rinsing twice in de-ionized water, and then in ethyl alcohol. The second etching step was performed on five of the tools treated in the first step. The tools were placed in a 1000 ml beaker containing 50 ml of 10 wt. % NaOH solution, to which 25 ml of 30 wt. % $H_2O_2$ were slowly added. The beaker was placed in a water bath to minimize the temperature increase and frothing. The temperature of the solution rose to about 65° C. in three minutes, and then decreased to about 40° C. after about 7 minutes. The inserts were removed from the etching solution after 15 minutes, ultrasonically cleaned, rinsed and dried. Examination of the top rake surfaces at high magnification revealed surfaces which were similar to that shown in FIG. 3.

One of the etched inserts was placed in an ASTeX HPMS 1.5. KW microwave plasma CVD reactor operating at a frequency of 2.45 GHz. The chamber was evacuated to a pressure of about 25 torr and a hydrogen plus 3% methane plasma was initiated at a power of 1 KW. The reactant flow rate was 200 sccm. The temperature of the tool was measured by a "Mirage" Infra-red pyrometer manufactured by IRCON, and was found to be approximately 900° C. throughout the deposition. The thickness of the diamond film deposited was approximately 10 µm, and the crystallographic orientation of the film was <100>.

The coated tool was subjected to machining tests. In the turning test, the parameters were: speed=2000 surface feet per minute (sfm), feed=0.010 inches per revolution (ipr), depth of cut (doc)=0.060 inches, work-piece material= aluminum-silicon alloy A-390. Flood coolant was directed at the tool/work-piece contact point during machining. Three corners of the tool were tested under these conditions, and an average tool life of about 1 minute was obtained. The cause of tool failure was wear-induced chipping. There was no delamination of the diamond coating.

In the milling test, the parameters were: speed=1645 sfm, feed=0.0105 inches per tooth (ipt), doc=0.100 inch per pass. A 6" diameter, single-tooth cutter was used to test a single tool at a time in the milling of the A-390 alloy. No coolant was used in this test. The tool completed five passes without failure. The acceptance criterion in this test was five passes without spalling of the coating or chipping of the cutting edge.

For comparison, a commercially available diamond-coated C-2 carbide tool having approximately 10 µm thick diamond coating with a <111> crystal orientation was tested in these tests. In turning, the tool lasted about 1 minute and failed by spalling of the coating. In milling, the tool failed after five passes due to spalling of the coating.

Example 48

Tools were etched as described in example 47, except that the temperature of the second etching solution was maintained at approximately 50° C., and the etching time was about 120 minutes. One of these tools was coated in the diamond deposition reactor as described in example 47. For the first four hours of deposition, the concentration of methane in hydrogen was 1.5%. Under these conditions, the diamond film was deposited with a predominant <111> orientation. Following deposition at 1.5% methane concentration, the conditions were changed to 3% methane concentration for the last six hours. Under these conditions, the diamond film grew in the <100> orientation. After a total of ten hours of deposition, the thickness of diamond film was approximately 20 µm. The temperature of deposition during the first four hours was about 920° C., and during the next six hours was about 915° C. The tool was tested in turning as described in example 47. A tool life of about 6 minutes was obtained. The failure mode was wear. There was no spalling of the coating.

Example 49

Tool inserts etched as described in example 48 were placed in the diamond deposition reactor, as described in example 47. A mixture of hydrogen and dimethylether was used for diamond deposition. The concentration of dimethylether was 3% of total flow and the deposition temperature was approximately 900° C. The thickness of diamond film after a deposition time of 7 hours was about 13 µm and the crystal orientation was <100>. Turning test as described in example 47 gave a tool life of about 1 minute. Tool failure was due to wear-induced chipping. There was no spalling of the diamond coating.

Example 50

Another tool insert was prepared as described in example 48 and coated in the diamond deposition reactor using the following parameters: concentration of dimethylether= 1.5%, substrate temperature=890° C., deposition time=7 hours. The thickness of diamond coating was about 8 µm, and the orientation was <111>.

Example 51

Several tool inserts were prepared as described in example 48, and sent to an outside vendor for diamond deposition using the vendor's microwave plasma CVD process. A thickness of approximately 25 µm was deposited with a crystal orientation of predominantly <111>. A turning test as described in example 47 was performed on one of the tools. The tool lasted for about 7 minutes before failure due to slight chipping. There was no spalling of the diamond coating.

Example 52

Ten inserts of C2 grade, style SPG 422, were etched in a freshly prepared solution of 0.05M $FeCl_3$ solution with constant stirring to give a depth of etch of approximately 4 microns. The tools were rinsed twice in de-ionized water, and in alcohol. Five of these tools were then etched in a mixture of 50 ml of 10 wt. % NaOH+25 ml of 30 wt. % $H_2O_2$ in a 1000 ml beaker for about 180 minutes. The etching temperature was about 50° C. The tools thus prepared were sent to an outside vendor for diamond coating. This vendor used the hot-filament CVD method for depositing diamond coatings, which were about 25 to 30 µm thick. One of these coated tools was tested in turning using the following parameters: speed=2000 sfm, feed=0.005 ipr, doc=0.020 inch, work-piece material=A-390 alloy. The tool lasted about 7.5 minutes before failure due to wear. There was no spalling of the diamond coating.

Example 53

Thirty tool inserts of grade C2, style TPG 322, were etched in freshly prepared 0.1M $FeCl_3$ solution for 5 minutes with constant stirring to give depths of etch of 8–9 microns. The inserts were then rinsed as described in example 47. Eight of the tools from the first step were placed in a 1000 ml beaker containing 100 ml of freshly prepared 10 wt. % NaOH solution at 50° C., to which 50 ml of 30 wt. % $H_2O_2$ were added slowly. The temperature increased to about 80° C. in about 5 minutes. After ten minutes, the temperature dropped to about 65° C. The etching process was carried out for a total of 60 minutes.

These tools were sent to an outside vendor for diamond deposition using the microwave plasma CVD method. The coating thickness was about 25 µm. One of the coated tools was tested in turning as described in Example 47. The average tool life was about 17 minutes. The tool failed by wear. There was no spalling of the diamond coating.

What is claimed is:

1. A product comprising:
   a ground cemented tungsten carbide substrate having cobalt binder therein;
   a surface of said substrate being essentially free of a portion of said cobalt binder and damaged surface grains of metal carbide to a desired depth;
   a continuous film of diamond deposited on a desired portion of said surface of said substrate;
   said portion of said cobalt binder being removed by etching in a first chemical system; and
   said damaged surface grains of metal carbide being removed by etching in a second chemical system comprising an oxygen-containing anion while not substantially etching said cobalt binder further.

2. A product as claimed in claim 1 wherein said cemented tungsten carbide substrate is unpolished.

3. A product as claimed in claim 1 wherein said cemented tungsten carbide substrate is polished.

4. A product as claimed in claim 1 wherein said cemented tungsten carbide substrate contains up to about 30 wt. % cobalt binder.

5. A product as claimed in claim 1 wherein said cemented tungsten carbide substrate contains from about 3 wt. % to about 16 wt. % cobalt binder.

6. A product as claimed in claim 1 wherein the continuous diamond film is a substantially continuous CVD polycrystalline diamond film characterized in that the carbon source for the production of the diamond film is selected from the group comprising aliphatic hydrocarbons, aliphatic hydrocarbons containing oxygen, and mixtures thereof with hydrogen.

7. A product as claimed in claim 6 wherein the continuous diamond film is a substantially continuous CVD polycrystalline diamond film characterized in that the carbon source for the production of the diamond film is dimethyl ether.

8. A product as claimed in claim 1 wherein said product is a metal cutting insert.

9. A product comprising:
   a ground cemented metal carbide substrate having cobalt binder therein;
   a surface of said substrate being essentially free of a portion of said cobalt binder and damaged surface grains of metal carbide to a desired depth;
   a continuous film of diamond deposited on a desired portion of said surface of said substrate;
   said portion of said cobalt binder being removed by etching in a first chemical system; and
   said damaged surface grains of metal carbide being removed by etching in a second chemical system comprising an oxygen-containing anion while not substantially etching said cobalt binder further.

10. A product as claimed in claim 9 wherein said cemented metal carbide substrate is unpolished.

11. A product as claimed in claim 9 wherein said cemented metal carbide substrate is polished.

12. A product as claimed in claim 9 wherein said cemented metal carbide substrate contains up to about 3 wt. % cobalt binder.

13. A product as claimed in claim 9 wherein said cemented metal carbide substrate contains from about 3 wt. % to about 16 wt. % cobalt binder.

14. A product as claimed in claim 9 wherein the metal carbide substrate is selected from the group consisting of tungsten carbide, titanium carbide, tantalum carbide, niobium carbide, vanadium carbide, and combinations thereof.

15. A product as claimed in claim 14 wherein the metal substrate consists of tungsten carbide.

16. A product as claimed in claim 9 wherein the continuous diamond film is a substantially continuous CVD polycrystalline diamond film characterized in that the carbon source for the production of the diamond film is selected from the group comprising aliphatic hydrocarbons, aliphatic hydrocarbons containing oxygen, and mixtures thereof with hydrogen.

17. A product as claimed in claim 9 wherein the continuous diamond film is a substantially continuous CVD polycrystalline diamond film characterized in that the carbon source for the production of the diamond film is dimethyl ether.

18. A product as claimed in claim 9 wherein said product is a metal cutting insert.

19. A product comprising:
   a cemented metal carbide substrate having cobalt binder therein;
   a surface of said substrate being essentially free of a portion of said cobalt binder and any surface grains of metal carbide to a desired depth;
   a continuous film of diamond deposited on a desired portion of said surface of said substrate;
   said portion of said cobalt binder being removed by etching in a first chemical system; and
   said surface grains of metal carbide being removed by etching in a second chemical system comprising an oxygen-containing anion while not substantially etching said cobalt binder further.

20. A product as claimed in claim 19 wherein said cemented metal carbide substrate is unpolished.

21. A product as claimed in claim 19 wherein said cemented metal carbide substrate is polished.

22. A product as claimed in claim 19 wherein said cemented metal carbide substrate contains up to about 30 wt. % cobalt binder.

23. A product as claimed in claim 19 wherein said cemented metal carbide substrate contains from about 3 wt. % to about 16 wt. % cobalt binder.

24. A product as claimed in claim 19 wherein said metal carbide substrate is selected from the group consisting of tungsten carbide, titanium carbide, tantalum carbide, niobium carbide, vanadium carbide, and combinations thereof.

25. A product as claimed in claim 24 wherein said metal carbide substrate is tungsten carbide.

26. A product as claimed in claim 19 wherein said product is a metal cutting insert.

27. A product as claimed in claim 19 wherein the continuous diamond film is a substantially continuous CVD polycrystalline diamond film characterized in that the carbon source for the production of the diamond film is selected from the group comprising aliphatic hydrocarbons, aliphatic hydrocarbons containing oxygen, and mixtures thereof with hydrogen.

28. A product as claimed in claim 19 wherein the continuous diamond film is a substantially continuous CVD polycrystalline diamond film characterized in that the carbon source for the production of the diamond is dimethyl ether.

29. A cutting tool comprising:
   a cemented metal carbide substrate having cobalt binder therein;
   a surface of said substrate being essentially free of a portion of said cobalt binder and selected surface grains of metal carbide to a desired depth;

a continuous film of diamond deposited on a desired portion of said surface of said substrate;

said portion of said cobalt binder being removed by etching in a first chemical system; and said selected surface grains of metal carbide being removed by etching in a second chemical system comprising an oxygen-containing anion while not substantially etching said cobalt binder further.

30. A cutting tool as claimed in claim 29 wherein said cemented metal carbide substrate comprises a ground cemented metal carbide substrate.

31. A cutting tool as claimed in claim 29 wherein said cemented metal carbide substrate comprises a ground cemented tungsten carbide substrate.

* * * * *